(12) United States Patent
Chow et al.

(10) Patent No.: US 9,106,262 B2
(45) Date of Patent: *Aug. 11, 2015

(54) MEMORY EFFICIENT IMPLEMENTATION OF LDPC DECODER

(71) Applicant: Hong Kong Applied Science and Technology Research Institute Company Limited, Hong Kong (HK)

(72) Inventors: Felix Chow, Hong Kong (HK); Chun Hang Lee, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/222,688

(22) Filed: Mar. 24, 2014

(65) Prior Publication Data

US 2014/0289591 A1   Sep. 25, 2014

Related U.S. Application Data

(62) Division of application No. 13/027,277, filed on Feb. 15, 2011, now Pat. No. 8,879,640.

(51) Int. Cl.
*H04N 7/12* (2006.01)
*H04N 11/02* (2006.01)
*H04N 11/04* (2006.01)
(Continued)

(52) U.S. Cl.
CPC ...... *H03M 13/1125* (2013.01); *H03M 13/1111* (2013.01); *H03M 13/255* (2013.01); *H03M 13/2707* (2013.01); *H03M 13/2778* (2013.01); *H03M 13/2792* (2013.01);
(Continued)

(58) Field of Classification Search
USPC ..................................................... 375/240.25
See application file for complete search history.

(56) References Cited

U.S. PATENT DOCUMENTS

2004/0240590 A1   12/2004   Cameron et al.
2009/0222636 A1   9/2009   Yano et al.
(Continued)

FOREIGN PATENT DOCUMENTS

CN   101785188 A   7/2010

OTHER PUBLICATIONS

Office Action issued from the State Intellectual Property Office of the P.R.C. on Nov. 22, 2013, including a search report.
(Continued)

*Primary Examiner* — Hee-Yong Kim
(74) *Attorney, Agent, or Firm* — Ella Cheong Hong Kong; Sam T. Yip

(57) ABSTRACT

A computer processor implementable method of decoding low-density parity-check (LDPC) code, comprising: receiving a log-likelihood-ratio (LLR) input bitstream; performing a combined bit-deinterleaving and reordering process on the LLR input bitstream and storing in a physical memory space, comprising: determining a logical memory address for each LLR bit in the LLR input bitstream, determining a physical memory address for each LLR bit in the LLR input bitstream from logical memory address of the LLR bit; decoding the LLR input bitstream stored in the physical memory space; and performing a combined de-reordering and de-mapping process on the decoded LLR input bitstream.

14 Claims, 9 Drawing Sheets

(51) Int. Cl.
*H03D 1/00* (2006.01)
*H04L 27/06* (2006.01)
*H03M 13/11* (2006.01)
*H03M 13/25* (2006.01)
*H03M 13/27* (2006.01)
*H03M 13/00* (2006.01)
*H03M 13/15* (2006.01)
*H03M 13/29* (2006.01)

(52) U.S. Cl.
CPC ..... *H03M 13/6505* (2013.01); *H03M 13/1102* (2013.01); *H03M 13/1515* (2013.01); *H03M 13/2906* (2013.01)

(56) References Cited

U.S. PATENT DOCUMENTS

2010/0077276 A1* 3/2010 Okamura et al. ............. 714/752
2011/0154160 A1* 6/2011 Yurzola et al. ................ 714/763

OTHER PUBLICATIONS

Office Action issued from the State Intellectual Property Office of the P.R.C. on Aug. 5, 2014.

* cited by examiner

MEMORY EFFICIENT IMPLEMENTATION OF LDPC DECODER

CROSS-REFERENCES TO RELATED APPLICATIONS

This application is a divisional application of the U.S. patent application Ser. No. 13/027,277 filed Feb. 15, 2011, the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to digital signal broadcasting, and specifically mobile television broadcasting. Still more specifically, the present invention involves techniques of encoding and decoding digital messages transmitted over noisy communication medium.

BACKGROUND

In communication systems, when transmitting data across noisy channels or mediums such as wireless networks using radio frequency, microwave, and infrared, data can be lost or corrupted due to geographical and environmental factors and various signal noise sources. Such communication systems often employ error-correcting codes that introduce redundancy to the transmission of the data to ensure reliability of the data transmission, and in certain cases recover lost data and/or correct errors at the receiving end.

One fundamental aspect of data transmission through noisy channel is the Shannon limit, which defines the theoretical maximum rate at which data can be transmitted reliably through the channel. Error-correcting codes are designed to achieve sufficient reliability while approaching this limit. The Low Density Parity Check (LDPC) codes are such error correcting codes. Gallager, R. G., *Low Density Parity Check Codes*, Transactions of the IRE Professional Group on Information Theory, January 1962 explains the basic theory of the LDPC codes. MacKay, D. J. C. and Neal, R. M., *Near Shannon limit performance of low density parity check codes*. Electronics Letters. August 1996 further describes the characteristics of LDPC codes. Gallager, MacKay and Neal are hereby incorporated by reference in their entireties.

Traditionally, LDPC codes have not been widely adopted in practice due to a number of challenges. Encoding and decoding LDPC codes are highly complex. Another challenge is that encoding and decoding LDPC codes require storing very large non-sparse matrices, and that LDPC codes require large blocks to be effective, thus large data memory storage space is needed in the physical implementation. Therefore, there is a need, for communication systems that employ LDPC codes, to develop an encoding and decoding process that will reduce the amount of data memory storage space needed without introducing too much complexity.

U.S. Pat. No. 7,376,885 describes a method for reducing the memory storage requirement for check node message. The described method attempts to perform compression and decompression of check node messages so that less memory storage is used. However, this method fails to address the extra complexity, and the additional logic circuitry, for performing compression and decompression. In comparison, the presently claimed system and method focus on eliminating the memory buffers associated with the log-likelihood-ratio (LLR) data bits reordering, de-reordering, and demapping procedures, and that additional logic circuitry requirement is minimal.

Another way to reduce memory storage might be by modifying the LDPC coding scheme. U.S. Pat. No. 7,234,098 describes such a method by way of an encoder that generates a LDPC code having an outer Bose Chaudhuri Hocquenghem (BCH) code, which reduces the memory requirements for storage of the edge values. In comparison, the claimed system and method achieves memory storage reduction without modifying the LDPC codes.

SUMMARY

It is an objective of the presently claimed invention to provide a method and an apparatus for implementing a memory-efficient Low Density Parity Check (LDPC) decoder.

It is a further objective of the presently claimed invention to reduce the die-size and power consumption of the integrated circuit implementing the memory-efficient LDPC decoder.

In accordance with various embodiments, the presently claimed memory-efficient LDPC decoder is implemented by a demodulator integrated circuit (IC) used in a mobile communication device. The LDPC decoder enables memory efficiency by eliminating the memory buffers associated with the reordering, de-reordering, and demapping procedures of the LDPC decoding process. In an IC implementation of the LDPC decoder, such memory buffer eliminations can result in reduction in final die size and reduction in power consumption of the IC.

LDPC code is one type of binary linear block code. At the transmitter of data bits, for every block of data bits denoted as a K×1 vector s, an encoder generates a N×1 encoded bits vector c by determining $c=[p^T \cdot s^T]^T = Gs$ where G is a N×K generator matrix and the (N−K)×1 vector p contains the parity-check bits. Since all the data bits are contained in the encoded bits vector c, this type of binary linear block code is called "systematic." The coding rate of this code is defined as R=K/N. The N×1 encoded bits vector c passes through the communication transmission medium and reaches the receiver as a N×1 bits vector y, in which bit errors may exist due to noises or interferences during transport. At the receiver of the data bits, the task of the decoder, then, is to recover the encoded bits vector c from bits vector y by utilizing the characteristics of that Hc=0 where H is a (N−K)×N parity-check matrix and HG=0.

LDPC decoding on log-likelihood-ratio (LLR) data bits can be performed by a process comprising receiving the LLR data bits from a LLR source; performing a bit-deinterleaving memory access on the received LLR data bits generating a bit-deinterleaved bits vector LLR of the received LLR data bits; reordering the bit-deinterleaved bits vector LLR into LLR'; decoding LLR' to correct the erroneous information bits in the LLR data bits resulting in a decoded bits vector ĉ' which satisfies $\hat{H}\hat{c}'=0$ where $\hat{H}$ is a parity-check matrix; de-reordering ĉ' generating the de-reordered bits vector ĉ, and de-mapping the de-reordered bits vector ĉ, based on a de-mapping index table which dictates a new index or position for each bit of the de-reordered bits vector ĉ resulting at a decoded, de-reordered and de-mapped bits vector ŝ.

According to one embodiment of the presently claimed memory-efficient LDPC decoder, the stages of bit-deinterleaving memory access and reordering on the received LLR data bits are combined into a single operation such that the received LLR data bits are first assigned logical memory row-column addresses. Through a physical memory row-column address pre-calculation based on the logical memory address of each received LLR data bit, each received LLR data bit is stored immediately in a physical memory buffer at the pre-calculated physical memory address arriving at the same condition after the stage of reordering, which is the bit-deinterleaved and reordered bits vector LLR'. Consequently, the physical memory buffer for temporarily storing the LLR data bits during bit-deinterleaving is eliminated.

According to one embodiment of the presently claimed memory-efficient LDPC decoder, the stages of de-reordering the decoded bits vector ĉ' and de-mapping the de-reordered bits vector ĉ are combined in a single operation by generating a new de-mapping index table that accounts for the bit re-ordering such that when applied to the bits of the decoded bits vector ĉ', the de-reordered and de-mapped bits vector ŝ is directly determined. Consequently, the physical memory buffer for temporarily storing the bits of the de-reordered bits vector ĉ is eliminated.

According to one embodiment of the presently claimed memory-efficient LDPC decoder, after decoding LLR' resulting the decoded bits vector ĉ' the parity bits among the decoded bits vector ĉ' are omitted from further processing in subsequent stages as these parity bits are relevant only to the recovery of lost information bits. As a result, less computing cycles are needed in the subsequent stages.

BRIEF DESCRIPTION OF THE DRAWINGS

Embodiments of the invention are described in more detail hereinafter with reference to the drawings, in which.

DETAILED DESCRIPTION

In the following description, methods and apparatus of decoding low-density parity-check (LDPC) code and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
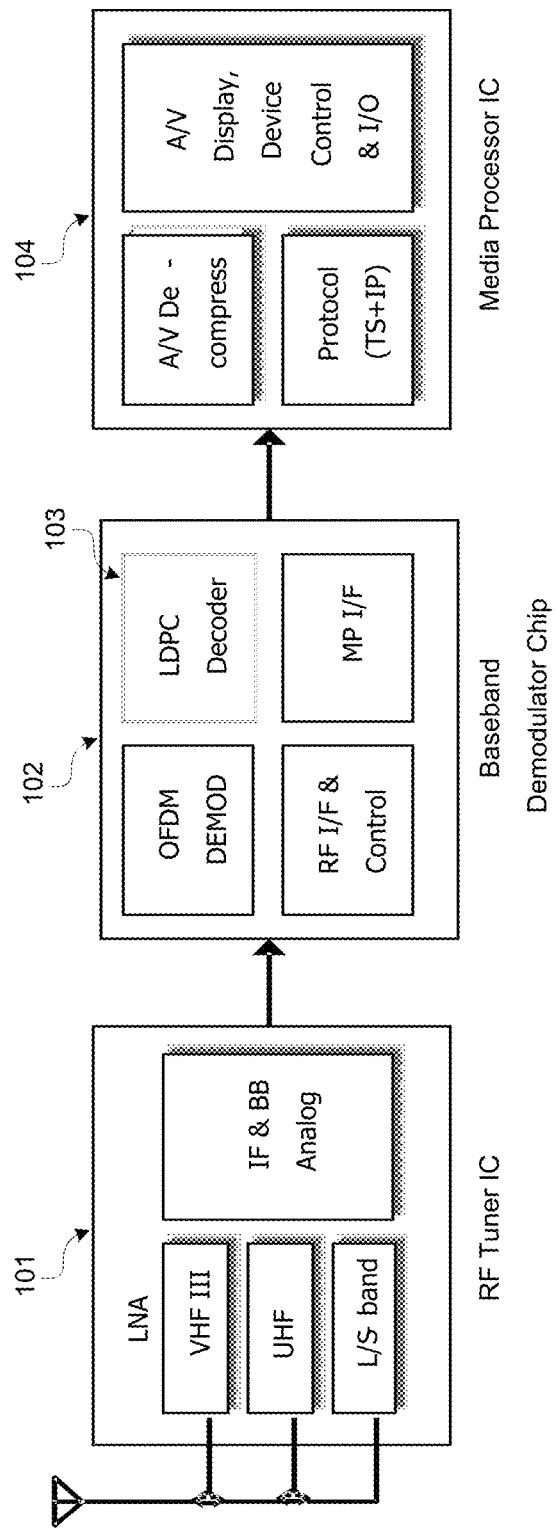
FIG. 1 shows a block diagram schematically illustrating a typical IC implementation of a LDPC decoder.

Referring to FIG. 1. In accordance with various embodiments, the presently claimed memory-efficient LDPC decoder is implemented by a baseband demodulator integrated circuit (IC) 102 used in a mobile communication device as a logical sub-module 103. One exemplary embodiment of the demodulator IC is the mobile television baseband demodulator silicon chip based on the China Mobile Multimedia Broadcasting (CMMB) standard. In the CMMB standard, a log-likelihood-ratio (LLR) input bitstream contains 15 LDPC codewords, each containing 9216 LLR bits.

Figure 2:
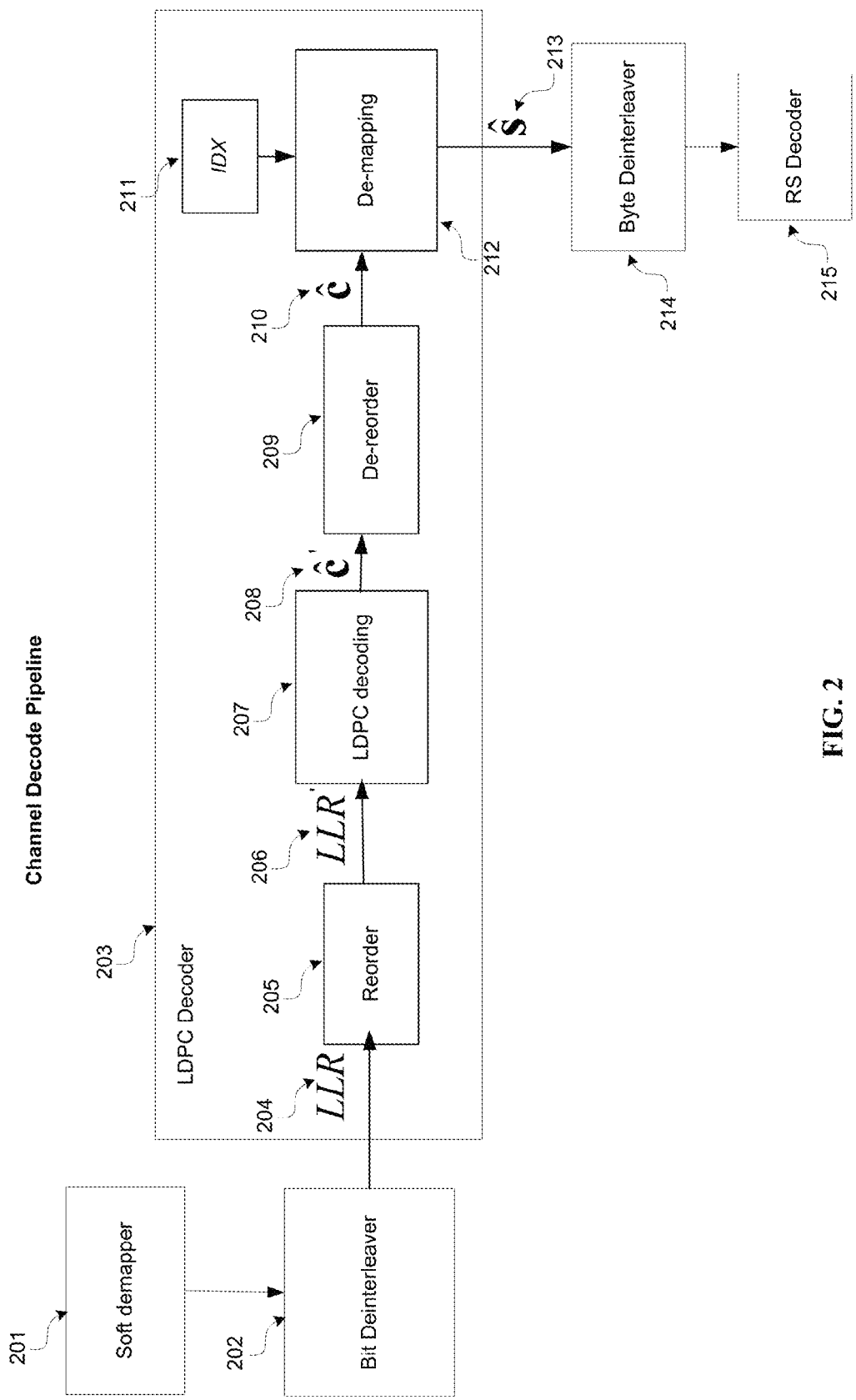
FIG. 2 shows a block diagram schematically illustrating a typical LDPC decoder module.

Referring to FIG. 2. The LDPC decoder 203 within the decoding pipeline can further sub-divide into four stages: reoder 205, LDPC decoding 207, de-reoder 209, and de-mapping 212. The LDPC decoding process begins with the bit-deinterleaver 202 receiving the LLR input bitstream from the soft-demapper 201; performing a bit-deinterleaving memory access on the received LLR input bitstream generating a bit-deinterleaved bits vector LLR 204; reordering the bit-deinterleaved bits vector LLR 204 into LLR' 206; decoding LLR' 206 to correct the erroneous information bits in the LLR data bits generating the a decoded bits vector ĉ' 208 which satisfies Ĥĉ'=0 where Ĥ is a parity-check matrix; de-reordering ĉ' generating the de-reordered bits vector ĉ 210; and de-mapping the de-reordered bits vector ĉ 210, based on a de-mapping index table (IDX) 211 which dictates a new index or position for each bit of the de-reordered bits vector ĉ 210 resulting a decoded, de-reordered and de-mapped bits vector ŝ 213.

The LLR input bitstream is to be stored in a front-end memory buffer as it goes through the bit-dinterleaver 202 before entering the reorder stage 205 as a bit-deinterleaved bits vector LLR 204. The presently claimed memory-efficient LDPC decoder combines the operations in the bit-deinterleaver 202 and the reorder stage 205 resulting the bit-deinterleaved and reordered bits vector LLR' 206 from the LLR input bitstream, thus eliminating the front end memory buffer. Also, the de-reordered bits vector ĉ 210 is stored in a back-end memory buffer allowing the de-mapping stage 212 to access the bits. The presently claimed memory-efficient LDPC decoder combines the operations in the de-reorder stage 209 and the de-mapping stage 212 resulting the de-reordered and de-mapped bits vector ŝ 213 directly from the decoded bits vector ĉ' 208.

Figure 3:
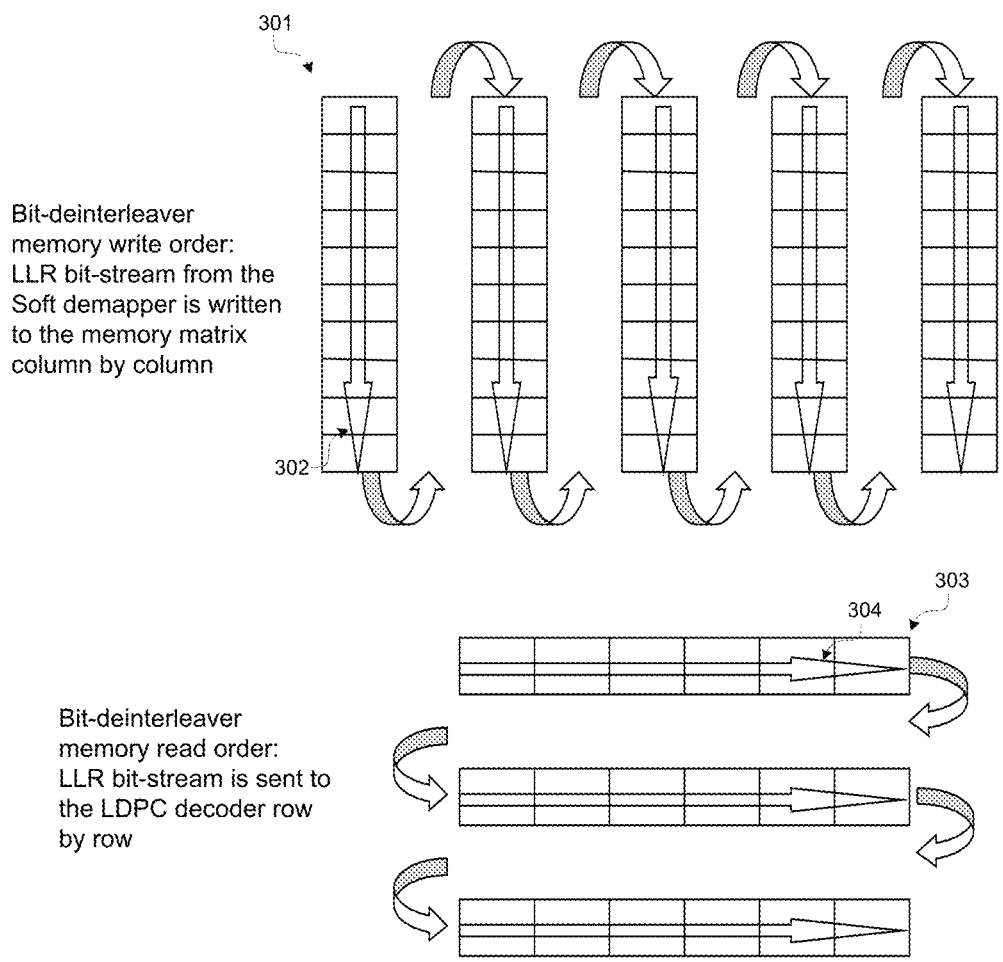
FIG. 3 illustrates schematically bit-deinterleaving memory writing and reading.

Referring to FIG. 3. In the bit-deinterleaver, bits of the LLR input bitstream are written to a front end memory buffer column (301) by column (301) from top to bottom and from left to right as shown by the direction arrows 302, which direction indicates the ascending positions of the bits in the LLR input bitstream being written. In one embodiment, the front end memory buffer has a width of 360 bits and depth of 384 bits. Thus, the total number of LLR bits it could process in one cycle is 384*360=138240 bits. Then the bits are read out to the reorder stage of the LDPC decoder row (303) by row (303) from left to right and from top to bottom as shown by the direction arrows 304, which direction indicates the ascending positions of the bits being read. For the $n^{th}$ input LLR bit (where n=0, 1, 2, ..., 138239), it will be written to the bit-deinterleaver memory buffer at the memory column and row addresses:

$x = n$ div 384; where $x$ is column address; $n$ is the bit's position in the LLR input bitstream={0,1, 2, ..., 138239}; and $y = n$ mod 384; where $y$ is row address.

Then during the reading out of the LLR bits from the memory buffer, for the $I_R^{th}$ output LLR bit (where $I_R$=0, 1, 2, . . . , 138239), the memory column and row addresses where it will be read from are:

$x=I_R$ div 360; where $x$ is column address; $I_R$ is the bit's position in the de-interleaved LLR input bitstream={0,1,2, . . . ,138239}; and $y=I_R$ mod 360; where $y$ is row address.

Therefore, from the above, for the $n^{th}$ input LLR bit to the bit-deinterleaver, the corresponding output LLR bit is at the output position:

$I_R$=360*$y$+$x$=360*($n$ mod 384)+($n$ div 384).

Figure 4:
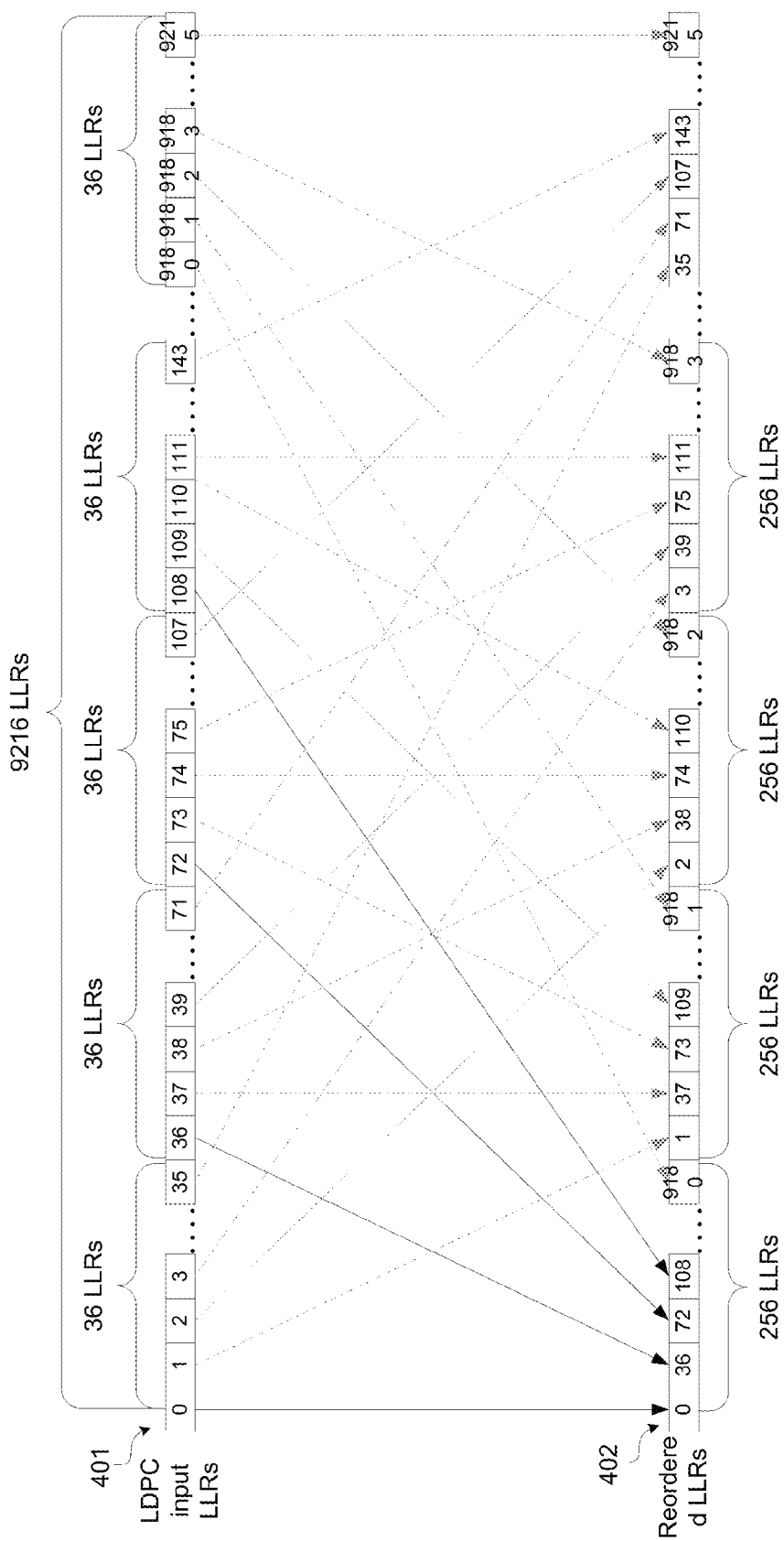
FIG. 4 illustrates schematically LLR data bits reordering.

In the LLR bit reorder stage, the de-interleaved LLR input bitstream is to be reordered by the LDPC codeword, and there are 15 LDPC codewords in one front-end memory buffer based on the CMMB standard. FIG. 4 illustrates the LLR bit reordering where consecutive bits in a reordered LDPC codeword 402 are taken from every 36 bit in a pre-reordered LDPC codeword 401, and consecutive bits in a pre-reordered LDPC codeword 401 will be separated by 256 bit positions in the corresponding reodered LDPC codeword 402. Therefore, the LLR bit at position i (where i=0, 1, 2, . . . 9125) in the $N_{LDPC}^{th}$ pre-reordered LDPC codeword (where $N_{LDPC}$=0, 1, 2, . . . , 14), is reordered to be at position j (where j=0, 1, 2, . . . 9125) in the $N_{LDPC}^{th}$ reordered LDPC codeword, such that:

LLR'($i_1$*256+$i_2$)=LLR($i_2$*36+$i_1$); $i_1$={0,1,2, . . . ,35}; $i_2$={0,1,2, . . . ,255}.

For the $m^{th}$ (where m=0, 1, 2, . . . 9125) bit in the $N_{LDPC}^{th}$ pre-reordered LDPC codeword, the corresponding bit in the $N_{LDPC}^{th}$ reodered LDPC codeword is at its bit position r where:

$r$=($m$ mod 36)*256+($m$ div 36); $r$={0,1,2, . . . ,9215};

$m=i_2$*36+$i_1$;

$i_1=m$ mod 36; and $i_2=m$ div 36.

For the $I_R^{th}$ bit in the pre-reordered LLR bit stream, it can be found to be at the m bit position of the $N_{LDPC}^{th}$ pre-reordered LDPC codeword by:

$N_{LDPC}=I_R$ div 9216; $N_{LDPC}$={0,1,2, . . . ,14}; and $m=I_R$ mod 9216.

Figure 5:
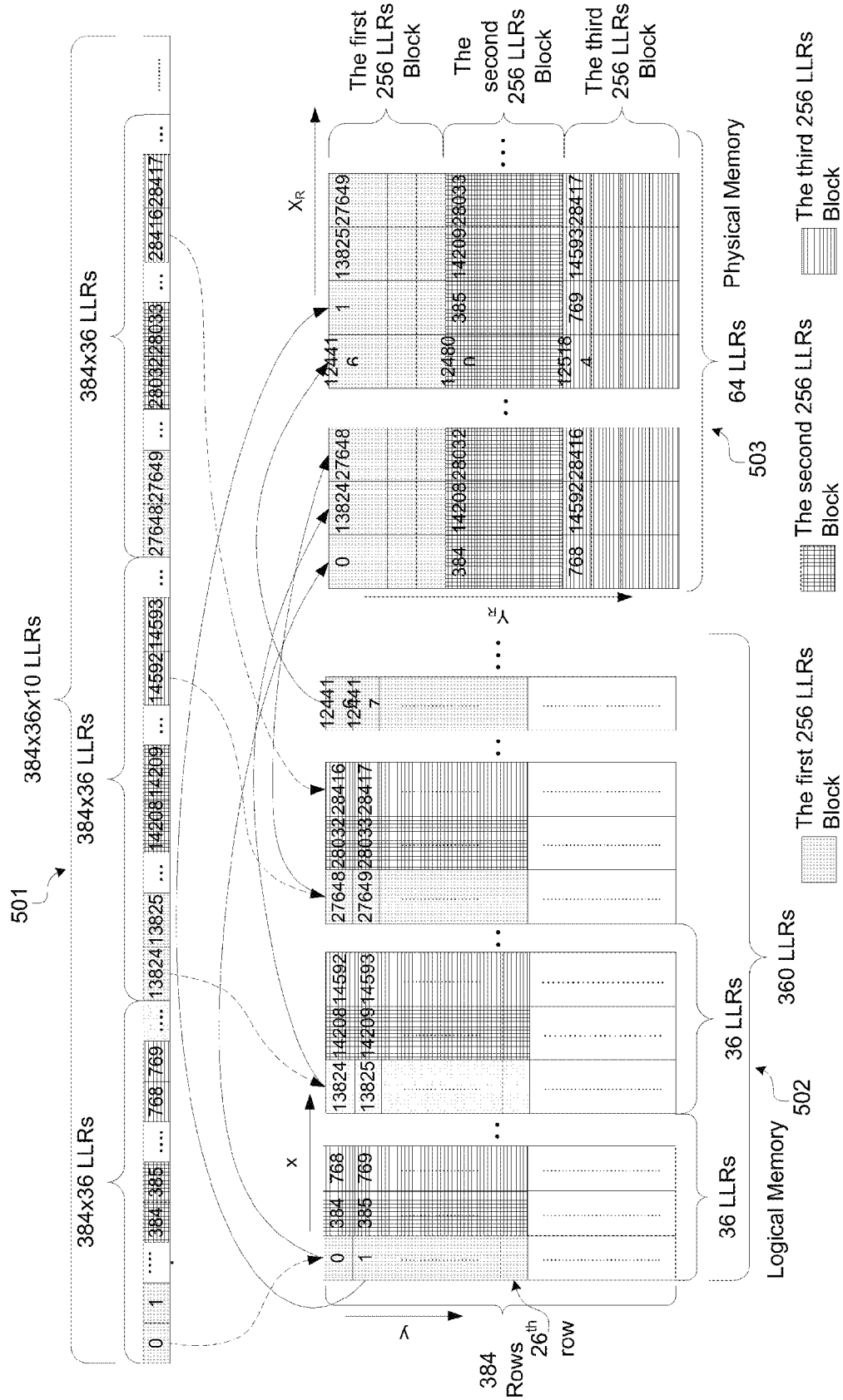
FIG. 5 illustrates schematically one embodiment of combining bit-deinterleaving and LLR data bits reordering.

Referring to FIG. 5. In the combined bit-deinterleaver and reorder operation, the LLR input bitstream is no longer stored in the front end memory buffer for a standalone bit-deinterleaving operation, instead each bit in the LLR input bitstream received by the LDPC decoder is first assigned a logical memory address in the same manner as it were to be written into the front end memory buffer as shown in 502. Thus, for the $I_R^{th}$ input LLR bit, its logical memory column and row addresses are:

$x=I_R$ div 384; where $x$ is logical memory column address; and $y=I_R$ mod 384; where $y$ is logical memory row address.

The input LLR bit is directly written into a physical memory to be processed by the LDPC decoding stage. Based on the input LLR bit's logical column and row memory addresses, the input LLR bits' physical column and row memory addresses are calculated such that the same results are obtained as if the input LLR bits were to be processed by the bit-deinterleaver then the reorder stage separately as shown in 503. In one embodiment, the physical memory has a width of 64 bits and a depth of 2160 bits. In this case, the $r^{th}$ bit in the $N_{LDPC}^{th}$ reodered LDPC codeword will have the physical column and row memory addresses:

$X_R = r$ mod 64;

where $X_R$ is the physical memory column address;

and $Y_R = N_{LDPC} * (9216/64) + r$ div 64;

where $Y_R$ is the physical memory row address = $N_{LDPC} * 144 + r$ div 64.

And by combining above equations, r can also be calculated from the input LLR bit's logical memory column and row addresses as follows:

$r$=(((360*$y$+$x$)mod 36)*256+(((360*$y$+$x$)mod 9216) div 36).

However, the above calculations involve a number of integer division and modulo arithmetic operations, which are non-trivial for hardware implementation. Thus, an iterative process is used to find the current division and modulo operation results based on the last division and modulo results.

In one embodiment, the combined bit-interleaving and reordering iterative process is shown below:

Combined Bit-Interleaving and Reordering Iterative Process:
Initiating the Bit-Interleaving and Reordering Iterative Process:

(1) Beginning with the first LLR bit in the LLR input bitstream,
  assigning the first LLR bit a logical memory column-row address and a physically memory column-row address:

($x,y$)=(0,0);

($X_R,Y_R$)=(0,0);

writing the first LLR bit into the physical memory at the address ($X_R, Y_R$);
resetting a LDPC codeword counter, $N_{LDPC}$, to 0;
resetting a remainder counter, $i_1$ to 0; and
resetting a quotient counter, $i_2$, to 0;

Assigning Logical Memory Address:
(2) Receiving the next LLR bit in the LLR input bitstream to be processed currently;

--- if the lastly processed LLR bit has a logical memory row address: $y_{last}$ = 383, then
{
    assigning the currently processed LLR bit a logical memory address: (x, y) = ($x_{last}$ + 1, 0), where $x_{last}$ is the logical memory column address of the lastly

```
   processed LLR bit; and
       resetting N_LDPC to 0;
}
else
{
   assigning the currently processed LLR bit a logical memory address: (x,
y) = (x_last, y_last + 1), where y_last is the logical memory row address of the lastly
processed LLR bit;
       skipping (3) to executing from (4) below;
}
```

(3) if x is not divisible by 36, then

```
{
    incrementing i_1 by 1;
}
else
{
    resetting i_1 to 0; and
    incrementing i_2 by 1;
}
```

Figure 6:
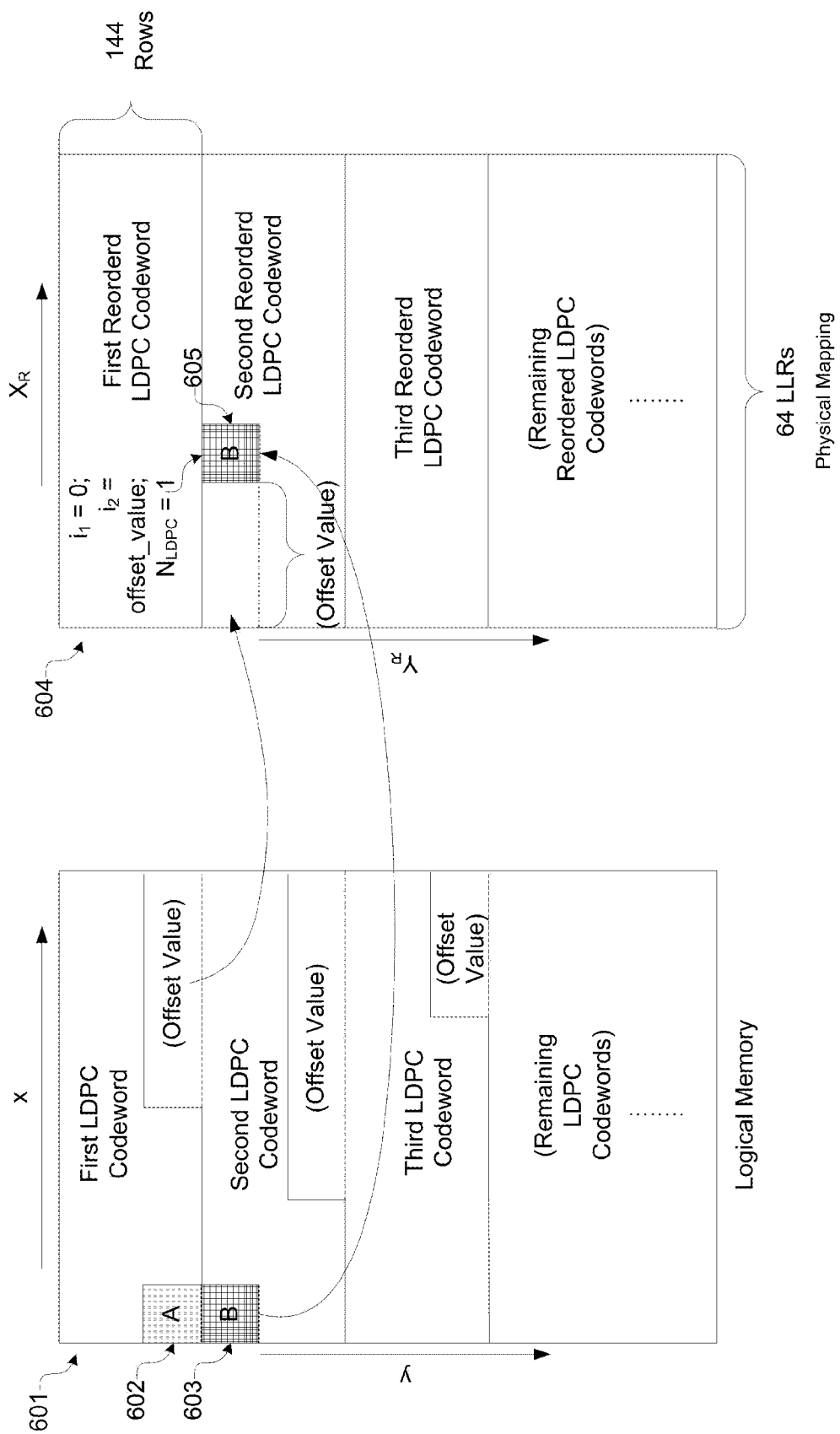
FIG. 6 illustrates schematically the calculation of the physical memory address of the LLR data bit under a case of crossing LDPC boundary.
Figure 7:
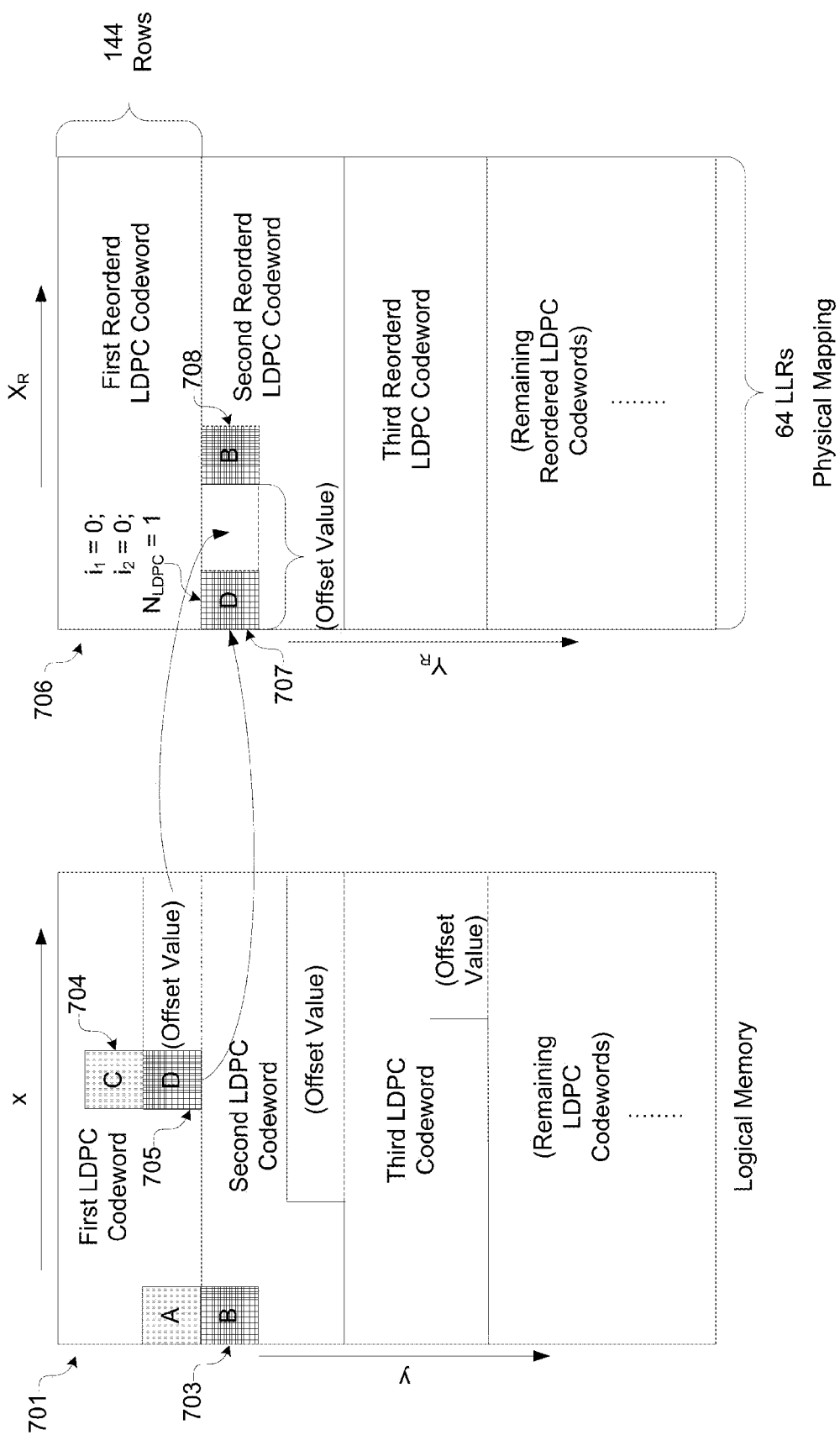
FIG. 7 illustrates schematically the calculation of the physical memory address of the LLR data bit under another case of crossing LDPC boundary.

Handling LDPC Codeword Boundary Crossing Condition:

Referring to FIG. 6 and FIG. 7. Because the logical memory address space has a width of 360 bit, the logical memory row address of a new LDPC codeword in the LLR input bitstream does not always begin at the beginning of a row (x=0), special consideration must be made for LDPC codeword boundary crossings.

(4) if y={25, 153, 281}, then

```
{
    i_2 = (x div 36) – 6;
}
else if y = {51, 179, 307}, then
{
    i_2 = (x div 36) – 2;
}
else if y = {76, 204, 332}, then
{
    i_2 = (x div 36) – 8;
}
else if y = (102, 230, 358}, then
{
    i_2 = (x div 36) – 4;
}
else if y = (128, 256}, then
{
    i_2 = (x div 36);
}
```

(5) if (y={25, 153, 281} and 216≤x≤359) or
   (y={51, 179, 307} and 72≤x≤359) or
   (y={76, 204, 332} and 288≤x≤359) or
   (y={102, 230, 358} and 144≤x≤359) or
   (y={128, 256}), then

```
{
    incrementing N_LDPC by 1;
}
else if y = {26, 154, 282} and 0 ≤ x ≤ 215, then
{
    incrementing N_LDPC by 1; and
    setting i_2 = (x div 36) + 4;
}
else if y = {52, 180, 308} and 0 ≤ x ≤ 71, then
{
    incrementing N_LDPC by 1; and
```

```
    setting i_2 = (x div 36) + 8;
}
else if y = {77, 205, 333} and 0 ≤ x ≤ 287, then
{
    incrementing N_LDPC by 1; and
    setting i_2 = (x div 36) + 2;
}
else if y = {103, 231, 359} and 0 ≤x ≤ 143, then
{
    incrementing N_LDPC by 1; and
    setting i_2 = (x div 36) + 6;
}
else
{
    incrementing i_2 by 10;
}
```

Determining the Physical Memory Address and Writing to Physical Memory:

(6) For the LLR bit (x, y) in the LLR input bitstream, writing into the physical memory space at a physical memory address:

$$X_R = (i_1 * 256 + i_2) \bmod 64; \text{ and}$$

$$Y_R = N_{LDPC} * 144 + *(i_1 256 + i_2);$$

Iterating:

(7) Repeating the execution from (2) for the next LLR bit in the LLR input bitstream until the last LLR bit in the LLR input bitstream is reached.

Figure 8:
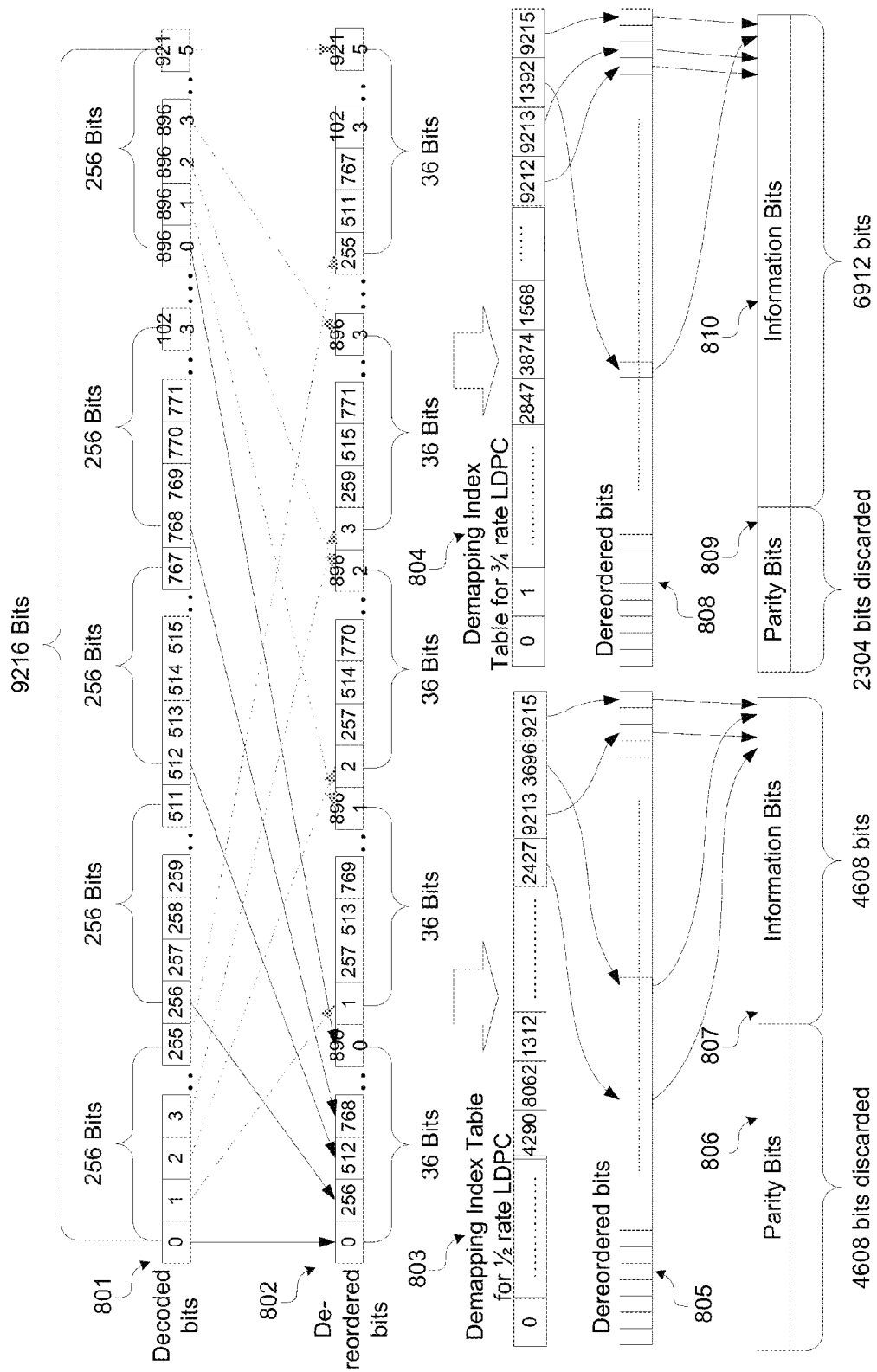
FIG. 8 illustrates schematically LLR data bits de-reordering and de-mapping.

FIG. 8 illustrates the separate LLR data bits de-reordering and de-mapping operations. The de-reordering operation is the reverse of the reordering operation. As shown in 801 and 802, consecutive bits in a de-reordred LDPC codeword are taken from every 256 bit in a pre-de-reordered (or decoded) LDPC codeword, and consecutive bits in a pre-de-reordered (or decoded) LDPC codeword will be separated by 36 bit positions in the corresponding de-reoedered LDPC codeword. The de-reodered LDPC codeword is then saved into a back-end memory buffer for the de-mapping stage.

In a de-mapping operation, bits in a de-reodered LDPC codeword are accessed based on the indexes in one of the pre-defined demapping index tables 803 and 804 for ½ rate LDPC and ¾ rate LDPC respectively. For the example in FIG. 8, by de-mapping the de-reordered LDPC codeword using the demapping index table 803, the 2427-positioned bit in the de-reordered LDPC codeword is de-mapped to the 9212 bit position of the de-mapped LDPC codeword; the 9213-positioned bit in the de-reordered LDPC codeword is de-mapped to the 9213 bit position of the de-mapped LDPC codeword; and 3696-positioned bit in the de-reordered LDPC codeword is de-mapped to the 9214 bit position of the de-mapped LDPC codeword. In addition, since after the decoding stage the parity bits in the decoded LDPC codewords are no longer needed in further processing, the pre-defined demapping index table can account for the parity ratio such that parity bits are ignored and only information bits are de-mapped, resulting in a reduction of unnecessary processing cycles, and reducing the memory to store the parity bits as well.

Figure 9:
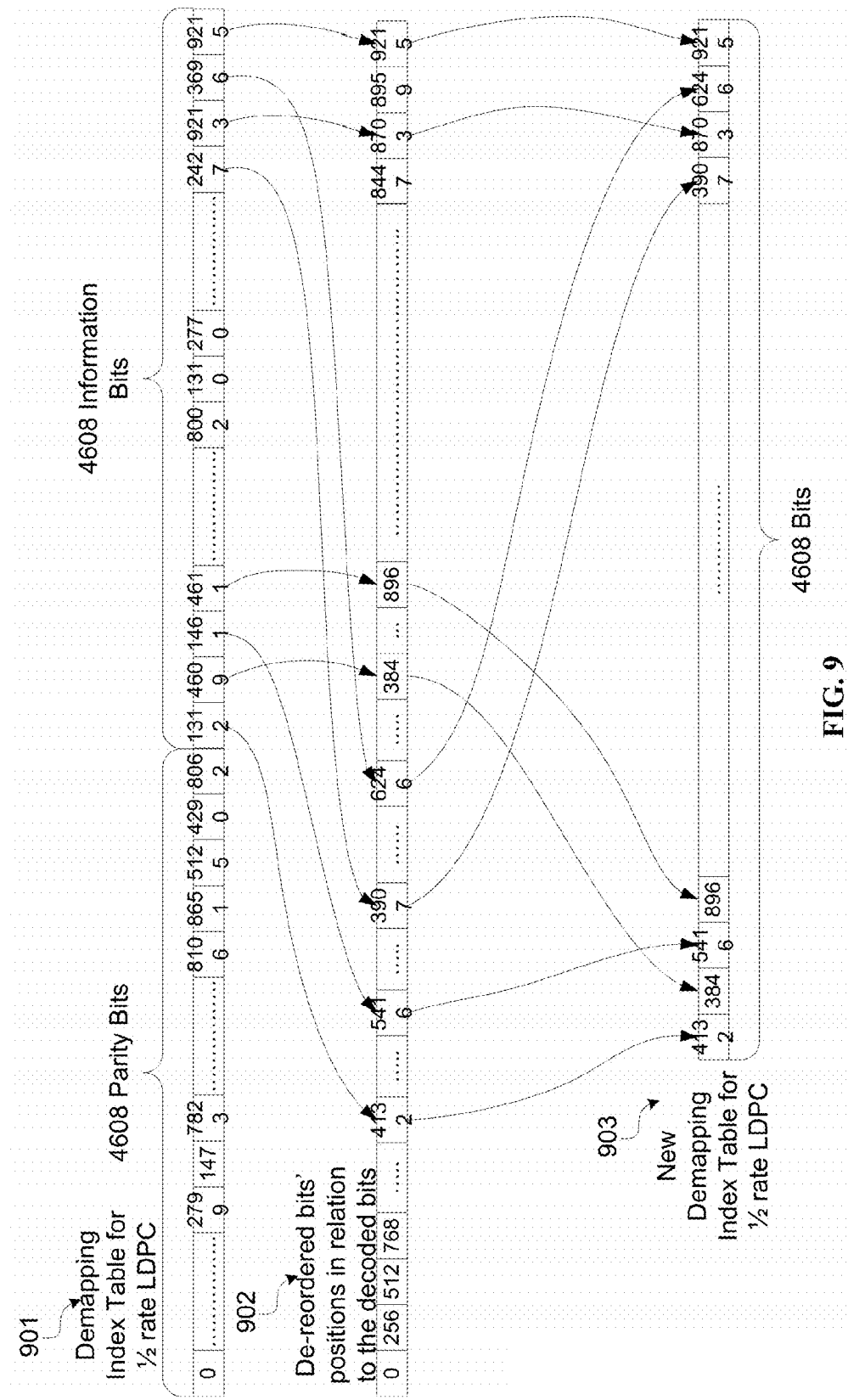
FIG. 9 illustrates schematically one embodiment of combing LLR data bits de-reordering and de-mapping.

Referring to FIG. 9. To combine the operations in the de-reoder and de-mapping stages, the original de-mapping index table 901 is modified to account for the de-reordering of the bits, such that the value of each index in the new de-mapping index table 903 is pointing to the bit position of the pre-de-reordered (decoded) LDPC codeword instead of the de-reordered LDPC codeword. For the example in FIG. 9, the $4608^{th}$ index in the original de-mapping index table 901 is pointing to the 1312 bit position of the de-reodered LDPC codeword; after translation, the $4608^{th}$ index in the new de-mapping index table 903 is pointing to the 4132 bit position of the pre-de-reordered LDPC codeword. Consequently, by using the new de-mapping index table 903, the bits in a pre-dereordered (or decoded) LDPC codeword are reorganized to form a de-reordered and de-mapped LDPC codeword, eliminating the need for the temporary storage in the back-end memory buffer.

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by practitioners skilled in the software or electronic art based on the teachings of the present disclosure.

In some embodiments, the present invention includes a computer storage medium having computer instructions or software codes stored therein which can be used to program a computer or microprocessor to perform any of the processes of the present invention. The storage medium can include, but is not limited to, floppy disks, optical discs, Blu-ray Disc, DVD, CD-ROMs, and magneto-optical disks, ROMs, RAMs, flash memory devices, or any type of media or device suitable for storing instructions, codes, and/or data.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A computer processor implementable method of decoding low-density parity-check (LDPC) code, comprising:
   receiving a log-likelihood-ratio (LLR) input bitstream;
   performing a combined bit-deinterleaving and reordering iterative process on each LLR bit in the LLR input bitstream without use of a front end memory buffer, comprising for each LLR bit in the LLR input bitstream:
      determining a logical memory address for the LLR bit using the logical memory address determined for the last LLR bit except for the first LLR bit in the LLR input bitstream, and
      determining a physical memory address for the LLR bit from the logical memory address of determined for the LLR bit and dimension of the physical memory;
   storing each LLR bit in the LLR input bitstream in the physical memory space according to the determined physical memory address for the LLR bit;
   decoding the LLR input bitstream stored in the physical memory space; and
   performing a combined de-reordering and de-mapping process on the decoded LLR input bitstream.

2. The method of claim 1, wherein the LLR input bitstream containing 15 LDPC codewords each containing 9216 LLR bits.

3. The method of claim 2,
   wherein the logical memory address for each LLR bit in the LLR input bitstream has a row and a column components within a logical memory matrix of 384 rows by 360 columns; and
   wherein each LLR bit in the LLR input bitstream is logically addressed incrementally with a column by column ascending order as the LLR input bitstream is received.

4. The method of claim 3,
   wherein the physical memory address has a row and a column components within a physical memory space of 2160 rows by 64 columns; and
   wherein each LLR bit in the LLR input bitstream is physically addressed by a memory address computation, comprising:
      (1) begin with the first LLR bit in the LLR input bitstream with logical memory row-column address of 0-0, assigning the first LLR bit a physical memory row-column address of 0-0, resetting a LDPC codeword counter to 0, resetting a remainder counter to 0, and resetting a quotient counter to 0;
      (2) if the logical memory row address of the LLR bit that has been processed in last iteration is 383, then setting the logical memory row address of the LLR bit that is currently being processed to 0 and assigning the logical memory column address of the LLR bit that is currently being processed to the logical memory column address of the LLR bit that has been processed in last iteration plus 1; else assigning the logical memory row address of the LLR bit that is currently being processed to the logical memory row address of the LLR bit that has been processed in last iteration plus 1, skipping (3) and executing from (4);
      (3) if the currently processed LLR bit's logical memory column address value is not divisible by 36, then incrementing the remainder counter by 1, else resetting the remainder counter to 0 and incrementing the quotient counter by 1;
      (4) if the currently processed LLR bit's logical memory row address is 25, 153, or 281, then setting the quotient counter to the currently processed LLR bit's logical memory column address, integer-divided by 36, then minus 6, else if the currently processed LLR bit's logical memory row address is 51, 179, or 307, then setting the quotient counter to the currently processed LLR bit's logical memory column address, integer-divided by 36, then minus 2, else if the currently processed LLR bit's logical memory row address is 76, 204, or 332, then setting the quotient counter to the currently processed LLR bit's logical memory column address, integer-divided by 36, then minus 8, else if the currently processed LLR bit's logical memory row address is 102, 230, or 358, then setting the quotient counter to the currently processed LLR bit's logical memory column address, integer-divided by 36, then minus 4, else if the currently processed LLR bit's logical memory row address is 128 or 256, then setting the quotient counter to the currently processed LLR bit's logical memory column address, integer-divided by 36;

(5) if the currently processed LLR bit's logical memory row address is 25, 153, or 281, and the currently processed LLR bit's logical memory column address is between 216 and 359, then incrementing the LDPC codeword counter by 1, else if the currently processed LLR bit's logical memory row address is 51, 179, or 307, and the currently processed LLR bit's logical memory column address is between 72 and 359, then incrementing the LDPC codeword counter by 1, else if the currently processed LLR bit's logical memory row address is 76, 204, or 332, and the currently processed LLR bit's logical memory column address is between 288 and 359, then incrementing the LDPC codeword counter by 1, else if the currently processed LLR bit's logical memory row address is 102, 230, or 358, and the currently processed LLR bit's logical memory column address is between 144 and 359, then incrementing the LDPC codeword counter by 1, else if the currently processed LLR bit's logical memory row address is 128 or 256, then incrementing the LDPC codeword counter by 1, else if the currently processed LLR bit's logical memory row address is 26, 154, or 282, and the currently processed LLR bit's logical memory column address is between 0 and 215, then incrementing the LDPC codeword counter by 1 and setting the quotient counter to the currently processed LLR bit's logical memory column address, integer-divided by 36, then plus 4, else if the currently processed LLR bit's logical memory row address is 52, 180, or 308, and the logical memory column address is between 0 and 71, then incrementing the LDPC codeword counter by 1 and setting the quotient counter to the currently processed LLR bit's logical memory column address integer-divided by 36, then plus 8, else if the logical memory row address is 77, 205, or 333, and the logical memory address is between 0 and 287, then incrementing the LDPC codeword counter by 1 and setting the quotient counter to the currently processed LLR bit's logical memory column address, integer-divided by 36, then plus 2, else if the currently processed LLR bit's logical memory row address is 103, 231, or 359, and the currently processed LLR bit's logical memory column address is between 0 and 143, then incrementing the LDPC codeword counter by 1 and setting the quotient counter to the currently processed LLR bit's logical memory column address, integer-divided by 36, then plus 6, else incrementing the quotient counter by 10;

(6) setting an intermediate variable to the sum of: (the remainder counter value multiplied by 256) and the quotient counter value; storing the currently processed LLR bit in the physical memory space at a physical memory row address equals to the sum of: (the LDPC codeword counter value multiplied by 144) and the intermediate variable value, and a physical memory column address equals to the intermediate variable value modulus by 64, and storing in the physical memory space according to the assigned physical memory row-column address; and (7) repeating execution from (2) for the next LLR bit in the LLR input bitstream unless the last LLR bit in the LLR input bitstream is reached.

5. The method of claim 1, where said combined de-reordering and de-mapping process on the decoded LLR input bitstream, comprising:

retrieving each of the decoded LDPC codewords in the decoded LLR input bitstream;

deriving from an original de-mapping index table a new de-mapping index table with each of its index value determined by combining de-reordering with each index of the original index de-mapping table such that the value of each index in the new de-mapping index table is pointing to the bit position of the decoded LDPC codeword; and reorganizing bits in each of the decoded LDPC codewords according to the new de-mapping index table.

6. The method of claim 5, wherein said retrieving decoded LDPC codewords comprises:

reading 9216 LLR bits at a time from the physical memory space at consecutive physical memory addresses with a row by row ascending order starting at physical memory column-row address of 0-0 to form each of the decoded LDPC codewords.

7. The method of claim 1, wherein the combined bit-deinterleaving and reordering iterative process further comprising using a LDPC codeword counter, a remainder counter, and a quotient counter in the determination of the logical memory address for the LLR bit and the determination of the physical memory address for the LLR bit.

8. An apparatus for decoding low-density parity-check (LDPC) code, comprising:

an interface for receiving a log-likelihood-ratio (LLR) input bitstream;

a first module for performing a combined bit-deinterleaving and reordering iterative process on each LLR bit in the LLR input bitstream without use of a front end memory buffer, comprising for each LLR bit in the LLR input bitstream:

determining a logical memory address for the LLR bit using the logical memory address determined for the last LLR bit except for the first LLR bit in the LLR input bitstream, and determining a physical memory address for the LLR bit from the logical memory address determined for the LLR bit and dimension of the physical memory;

storing each LLR bit in the LLR input bitstream in the physical memory space according to the determined physical memory address for the LLR bit;

a second module for decoding the LLR input bitstream stored in the physical memory space; and a third module for performing a combined de-reordering and de-mapping process on the decoded LLR input bitstream.

9. The apparatus of claim 8, wherein the LLR input bitstream containing 15 LDPC codewords each containing 9216 LLR bits.

10. The apparatus of claim 9, wherein the logical memory address for each LLR bit in the LLR input bitstream has a row and a column components within a logical memory matrix of 384 rows by 360 columns; and wherein each LLR bit in the LLR input bitstream is logically addressed incrementally with a column by column ascending order as the LLR input bitstream is received.

11. The apparatus of claim 10,
wherein the physical memory address has a row and a column components within a physical memory space of 2160 rows by 64 columns; and
wherein each LLR bit in the LLR input bitstream is physically addressed by a memory address computation, comprising:
(1) begin with the first LLR bit in the LLR input bitstream with logical memory row-column address of 0-0, assigning the first LLR bit a physical memory row-column address of 0-0, resetting a LDPC codeword counter to 0, resetting a remainder counter to 0, and resetting a quotient counter to 0;
(2) if the logical memory row address of the LLR bit that has been processed in last iteration is 383, then setting the logical memory row address of the LLR bit that is currently being processed to 0 and assigning the logical memory column address of the LLR bit that is currently being processed to the logical memory column address of the LLR bit that has been processed in last iteration plus 1; else assigning the logical memory row address of the LLR bit that is currently being processed to the logical memory row address of the LLR bit that has been processed in last iteration plus 1, skipping (3) and executing from (4);
(3) if the currently processed LLR bit's logical memory column address value is not divisible by 36, then incrementing the remainder counter by 1, else resetting the remainder counter to 0 and incrementing the quotient counter by 1;
(4) if the currently processed LLR bit's logical memory row address is 25, 153, or 281, then setting the quotient counter to the currently processed LLR bit's logical memory column address, integer-divided by 36, then minus 6, else if the currently processed LLR bit's logical memory row address is 51, 179, or 307, then setting the quotient counter to the currently processed LLR bit's logical memory column address, integer-divided by 36, then minus 2, else if the currently processed LLR bit's logical memory row address is 76, 204, or 332, then setting the quotient counter to the currently processed LLR bit's logical memory column address, integer-divided by 36, then minus 8, else if the currently processed LLR bit's logical memory row address is 102, 230, or 358, then setting the quotient counter to the currently processed LLR bit's logical memory column address, integer-divided by 36, then minus 4, else if the currently processed LLR bit's logical memory row address is 128 or 256, then setting the quotient counter to the currently processed LLR bit's logical memory column address, integer-divided by 36;
(5) if the currently processed LLR bit's logical memory row address is 25, 153, or 281, and the currently processed LLR bit's logical memory column address is between 216 and 359, then incrementing the LDPC codeword counter by 1, else if the currently processed LLR bit's logical memory row address is 51, 179, or 307, and the currently processed LLR bit's logical memory column address is between 72 and 359, then incrementing the LDPC codeword counter by 1, else if the currently processed LLR bit's logical memory row address is 76, 204, or 332, and the currently processed LLR bit's logical memory column address is between 288 and 359, then incrementing the LDPC codeword counter by 1, else if the currently processed LLR bit's logical memory row address is 102, 230, or 358, and the currently processed LLR bit's logical memory column address is between 144 and 359, then incrementing the LDPC codeword counter by 1, else if the currently processed LLR bit's logical memory row address is 128 or 256, then incrementing the LDPC codeword counter by 1, else if the currently processed LLR bit's logical memory row address is 26, 154, or 282, and the currently processed LLR bit's logical memory column address is between 0 and 215, then incrementing the LDPC codeword counter by 1 and setting the quotient counter to the currently processed LLR bit's logical memory column address, integer-divided by 36, then plus 4, else if the currently processed LLR bit's logical memory row address is 52, 180, or 308, and the logical memory column address is between 0 and 71, then incrementing the LDPC codeword counter by 1 and setting the quotient counter to the currently processed LLR bit's logical memory column address integer-divided by 36, then plus 8, else if the logical memory row address is 77, 205, or 333, and the logical memory address is between 0 and 287, then incrementing the LDPC codeword counter by 1 and setting the quotient counter to the currently processed LLR bit's logical memory column address, integer-divided by 36, then plus 2, else if the currently processed LLR bit's logical memory row address is 103, 231, or 359, and the currently processed LLR bit's logical memory column address is between 0 and 143, then incrementing the LDPC codeword counter by 1 and setting the quotient counter to the currently processed LLR bit's logical memory column address, integer-divided by 36, then plus 6, else incrementing the quotient counter by 10;
(6) setting an intermediate variable to the sum of: (the remainder counter value multiplied by 256) and the quotient counter value; storing the currently processed LLR bit in the physical memory space at a physical memory row address equals to the sum of: (the LDPC codeword counter value multiplied by 144) and the intermediate variable value, and a physical memory column address equals to the intermediate variable value modulus by 64, and storing in the physical memory space according to the assigned physical memory row-column address; and
(7) repeating execution from (2) for the next LLR bit in the LLR input bitstream unless the last LLR bit in the LLR input bitstream is reached.

12. The apparatus of claim 8, where said combined de-reordering and de-mapping process on the decoded LLR input bitstream, comprising:
retrieving each of the decoded LDPC codewords in the decoded LLR input bitstream;
deriving from an original de-mapping index table a new de-mapping index table with each of its index value determined by combining de-reordering with each index of the original index de-mapping table such that the value of each index in the new de-mapping index table is pointing to the bit position of the decoded LDPC codeword; and
reorganizing bits in each of the decoded LDPC codewords according to the new de-mapping index table.

13. The apparatus of claim 11, wherein said retrieving decoded LDPC codewords comprises:
reading 9216 LLR bits at a time from the physical memory space at consecutive physical memory addresses with a row by row ascending order starting at physical memory column-row address of 0-0 to form each of the decoded LDPC codewords.

14. The apparatus of claim 8, wherein the combined bit-deinterleaving and reordering iterative process further comprising using a LDPC codeword counter, a remainder counter, and a quotient counter in the determination of the logical memory address for the LLR bit and the determination of the physical memory address for the LLR bit.

* * * * *